(12) United States Patent
Wu et al.

(10) Patent No.: US 10,877,543 B2
(45) Date of Patent: Dec. 29, 2020

(54) LEVEL SHIFTER, INTEGRATED CIRCUIT, AND METHOD

(71) Applicants: Semiconductor Manufacturing International (Beijing) Corporation, Beijing (CN); Semiconductor Manufacturing International (Shanghai) Corporation, Shanghai (CN)

(72) Inventors: PingChen Wu, Shanghai (CN); JunTao Guo, Shanghai (CN); ChiaChi Yang, Shanghai (CN); TzuHan Lin, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 65 days.

(21) Appl. No.: 16/247,877

(22) Filed: Jan. 15, 2019

(65) Prior Publication Data
US 2019/0220078 A1 Jul. 18, 2019

(30) Foreign Application Priority Data
Jan. 16, 2018 (CN) .......................... 2018 1 0040856

(51) Int. Cl.
*H03K 19/00* (2006.01)
*G06F 1/3212* (2019.01)
*H03K 17/22* (2006.01)
*H03K 19/0185* (2006.01)

(52) U.S. Cl.
CPC .......... *G06F 1/3212* (2013.01); *H03K 17/22* (2013.01); *H03K 19/0016* (2013.01); *H03K 19/018521* (2013.01)

(58) Field of Classification Search
CPC ... H03K 19/018521; H03K 19/018528; H03K 19/00315; H03K 3/356113; H03K 19/0016; H03K 17/22; G06F 1/3212
See application file for complete search history.

(56) References Cited

U.S. PATENT DOCUMENTS

| 9,136,844 B2 * | 9/2015 | Furutani | ............ H03K 19/0013 |
| 2020/0118602 A1 * | 4/2020 | Yang | ....................... G11C 5/148 |
| 2020/0136426 A1 * | 4/2020 | Jackoski | ............ H03K 17/6872 |

\* cited by examiner

*Primary Examiner* — Long Nguyen
(74) *Attorney, Agent, or Firm* — Brinks Gilson & Lione

(57) ABSTRACT

The present disclosure provides implementations of a level shifter (LS), an integrated circuit, and a method. A LS may run in a first mode and a second mode, alternating with each other. The LS may include: an input unit that is configured to: transmit a first signal to a latch unit in the first mode, and be turned off in the second mode; a power supply switch unit that is configured to: transmit a first power supply voltage to the latch unit in the first mode, and transmit a second power supply voltage to the latch unit in the second mode, where the first power supply voltage is lower than the second power supply voltage; the latch unit that is configured to: latch the first signal in the first mode, change a level amplitude of the first signal from the first power supply voltage to the second power supply voltage in the second mode, and output a second signal whose logic is opposite to that of the first signal to an output unit; and the output unit that is configured to: isolate the second signal and output the second power supply voltage in the first mode, and output, in the second mode, a third signal whose logic is opposite to that of the second signal, where a level amplitude of the third signal is the second power supply voltage.

16 Claims, 6 Drawing Sheets

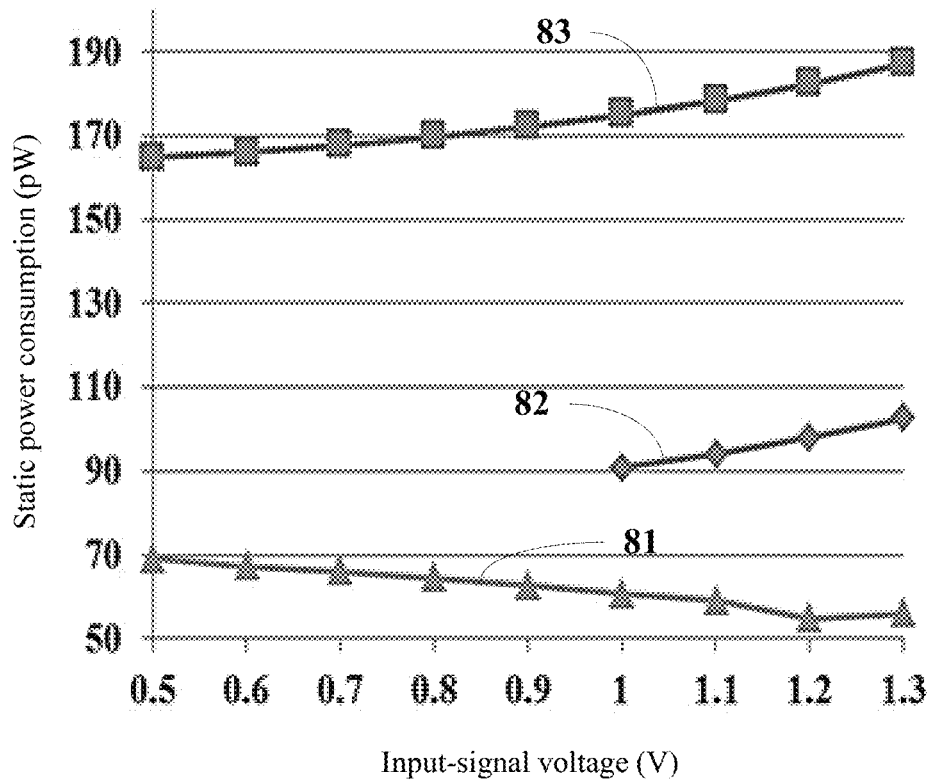

FIG. 8

In a first mode, an input unit receives a first signal and transmits the first signal to a latch unit, a power supply switch unit transmits a first power supply voltage to the latch unit, the latch unit latches the first signal and outputs a second signal whose logic is opposite to that of the first signal to an output unit, and the output unit isolates the received second signal and outputs a second power supply voltage — S902

In a second mode, the input unit is turned off, the power supply switch unit transmits the second power supply voltage to the latch unit, the latch unit changes a level amplitude of the latched first signal from the first power supply voltage to the second power supply voltage and outputs a second signal whose logic is opposite to that of the first signal to the output unit, and the output unit outputs, according to the received second signal, a third signal whose logic is opposite to that of the second signal, where a level amplitude of the third signal is the second power supply voltage — S904

LEVEL SHIFTER, INTEGRATED CIRCUIT, AND METHOD

RELATED APPLICATIONS

The present application claims priority to Chinese Patent Appln. No. 201810040856.X, filed Jan. 16, 2018, the entire disclosure of which is hereby incorporated by reference.

BACKGROUND

Technical Field

The present disclosure relates to the field of semiconductor technologies, and in particular, to a level shifter (LS), an integrated circuit, and a method.

Related Art

As technologies of wearable electronic devices evolve, a feature of low power consumption has become more important. Near-Threshold design maintains a high capability and has good power performance within a large-scaled low-voltage domain, and is therefore suitable for use in an Internet of Things (IoT) application. To further lower power consumption, an IoT apparatus that is in a deep sleep state for a long period of time may turn off blocks within the IoT apparatus that are not operating. Therefore, different voltage domains are usually formed in a circuit.

LSs are used for converting signal levels between different voltage domains, and to convert an unstable voltage into a rated output voltage. The LSs need to have a feature of rapid conversion and are expected to cause a transition energy and a static power consumption as low as possible.

In the prior art, there are LSs based on differential cascade voltage switch (DCVS) and LSs having an adaptive pull-up networks (PUNs) structure. When the LSs are applied to different voltage domains of an IoT apparatus, a logic error and a nonnegligible static power consumption may be caused. In addition, some LSs (for example, the LSs based on DCVS) require a low power supply voltage to not be excessively low, so that an application range is limited.

SUMMARY

The inventors of the present disclosure found the foregoing problems in the prior art, and put forward a new technical solution in view of at least one of the problems.

In one aspect of embodiments and implementations of the present disclosure, an LS is provided, configured to run in a first mode and a second mode alternating with each other, where the LS includes:

An input unit that is configured to: receive a first signal, be turned on in the first mode to transmit the first signal to a latch unit, and be turned off in the second mode;

A power supply switch unit that is configured to: transmit a first power supply voltage to the latch unit in the first mode, and transmit a second power supply voltage to the latch unit in the second mode, where the first power supply voltage is lower than the second power supply voltage;

The latch unit that is configured to: latch the first signal in the first mode, where a level amplitude of the latched first signal is equal to the first power supply voltage, change the level amplitude of the first signal from the first power supply voltage to the second power supply voltage in the second mode, and output, in each of the first mode and the second mode, a second signal whose logic is opposite to that of the first signal to an output unit; and The output unit that is configured to: isolate the received second signal and output the second power supply voltage in the first mode, and output, in the second mode according to the received second signal, a third signal whose logic is opposite to that of the second signal, where a level amplitude of the third signal is the second power supply voltage.

In some implementations, a level amplitude of the second signal in the first mode is equal to the first power supply voltage; and a level amplitude of the second signal in the second mode is equal to the second power supply voltage.

In some implementations, the latch unit includes: a signal input end that is configured to receive the first signal from the input unit; a voltage input end that is configured to: receive the first power supply voltage from the power supply switch unit in the first mode, and receive the second power supply voltage from the power supply switch unit in the second mode; and a signal output end that is configured to output the second signal to the output unit.

In some implementations, the latch unit further includes: a first p-channel metal oxide semiconductor (PMOS) transistor, a second PMOS transistor, a first N-channel metal oxide semiconductor (NMOS) transistor, a first node, and a second node, where a source of the first PMOS transistor and a source of the second PMOS transistor are connected to the voltage input end; a drain of the first PMOS transistor, a gate of the second PMOS transistor and a gate of the first NMOS transistor are connected to the first node, where the first node is connected to the signal input end; a gate of the first PMOS transistor, a drain of the second PMOS transistor and a drain of the first NMOS transistor are connected to the second node, where the second node is connected to the signal output end; and a source of the first NMOS transistor is connected to a ground terminal.

In some implementations, the input unit is further configured to be turned on or turned off according to a received enable signal.

In some implementations, the input unit includes a first switch transistor, where a gate of the first switch transistor is configured to receive the enable signal, a first electrode of the first switch transistor is configured to receive the first signal, and a second electrode of the first switch transistor is connected to the signal input end of the latch unit.

In some implementations, the power supply switch unit is further configured to: transmit the first power supply voltage to the latch unit after receiving a first selection signal in the first mode, and transmit the second power supply voltage to the latch unit after receiving a second selection signal in the second mode.

In some implementations, the power supply switch unit includes a second switch transistor and a third switch transistor, where a gate of the second switch transistor is configured to receive the first selection signal, and a first electrode and a second electrode of the second switch transistor are respectively connected to the voltage input end of the latch unit and a first power supply voltage end configured to provide the first power supply voltage; and a gate of the third switch transistor is configured to receive the second selection signal, and a first electrode and a second electrode of the third switch transistor are respectively connected to the voltage input end of the latch unit and a second power supply voltage end configured to provide the second power supply voltage.

In some implementations, when the second switch transistor and the third switch transistor are switch transistors having the same conductivity types, the first selection signal and the second selection signal are complementary signals; or when the second switch transistor and the third switch transistor are switch transistors having opposite conductivity types, the first selection signal and the second selection signal are same signals.

In some implementations, the output unit is further configured to output the second power supply voltage or the third signal according to a received isolation signal.

In some implementations, the output unit includes: a third PMOS transistor, a fourth PMOS transistor, a second NMOS transistor, and a third NMOS transistor, where a source of the third PMOS transistor and a source of the fourth PMOS transistor are connected to a second power supply voltage end configured to provide the second power supply voltage; a gate of the third PMOS transistor and a gate of the second NMOS transistor are connected to the signal output end of the latch unit; a gate of the fourth PMOS transistor and a gate of the third NMOS transistor are connected to each other and are configured to receive the isolation signal; a drain of the third PMOS transistor, a drain of the fourth PMOS transistor and a drain of the third NMOS transistor are connected to each other and serve as an output end of the output unit; a source of the third NMOS transistor is connected to a drain of the second NMOS transistor, and a source of the second NMOS transistor is connected to a ground terminal.

In some implementations, the enable signal and the second selection signal are set mode running signals, and the first selection signal and the isolation signal are complementary signals of the mode running signals.

In some implementations, the LS further includes: a phase inverter, configured to: after receiving the mode running signals, output the complementary signals of the mode running signals to the power supply switch unit and the output unit.

In another aspect of embodiments of the present disclosure, an integrated circuit is provided, including the foregoing LS.

In yet another aspect of embodiments of the present disclosure, a method of performing level shifting processing by using the foregoing LS is provided. The method may include: in a first mode, receiving, by an input unit, a first signal and transmitting the first signal to a latch unit, transmitting, by a power supply switch unit, a first power supply voltage to the latch unit, latching, by the latch unit, the first signal and outputting a second signal whose logic is opposite to that of the first signal to an output unit, and isolating, by the output unit, the received second signal and outputting a second power supply voltage; and in a second mode, turning off the input unit, transmitting, by the power supply switch unit, the second power supply voltage to the latch unit, changing, by the latch unit, a level amplitude of the latched first signal from the first power supply voltage to the second power supply voltage and outputting a second signal whose logic is opposite to that of the first signal to the output unit, and outputting, by the output unit according to the received second signal, a third signal whose logic is opposite to that of the second signal, where a level amplitude of the third signal is the second power supply voltage.

In some implementations, the step performed in the first mode and the step performed in the second mode are alternately performed.

In some forms of the LS described above, the LS includes: an input unit, a power supply switch unit, a latch unit, and an output unit. In the LS, in a first mode, the input unit transmits a received first signal to the latch unit, the power supply switch unit transmits a first power supply voltage to the latch unit, the latch unit latches the first signal and outputs a second signal whose logic is opposite to that of the first signal to the output unit, and the output unit isolates the received second signal and outputs a second power supply voltage; and in a second mode, the input unit is turned off, the power supply switch unit transmits the second power supply voltage to the latch unit, the latch unit changes a level amplitude of the latched first signal from the first power supply voltage to the second power supply voltage and outputs a second signal to the output unit, and the output unit outputs, according to the received second signal, a third signal whose logic is opposite to that of the second signal, where a level amplitude of the third signal is the second power supply voltage. By using forms of the LS described in the present disclosure, signal isolation may be implemented between different voltage domains, so that a logic error can be avoided as much as possible. Furthermore, a static power consumption can be reduced by using forms of the foregoing LS.

In addition, in an LS in forms of the present disclosure, a voltage selection function and an isolation function are integrated into an architecture of the LS, so that the single LS not only can select an input voltage, but also implement the isolation function when not operate.

Other features and advantages of the present disclosure are clearer through detailed descriptions of exemplary embodiments of the present disclosure with reference to the accompanying drawings.

BRIEF DESCRIPTION OF THE DRAWINGS

The accompanying drawings forming a part of the specification describe embodiments of the present disclosure, and are used for explaining the principles of the present disclosure together with the specification.

The present disclosure may be understood more clearly with reference to the accompanying drawings and according to the following detailed descriptions.

FIG. 8 is a diagram of a test result relationship between a static power consumption and an input-signal voltage of an LS in the prior art and that of an LS according to a form of the present disclosure; and FIG. 9 is a flowchart of a method of performing level shifting processing by using an LS according to some forms of the present disclosure.

DETAILED DESCRIPTION

Figure 1:
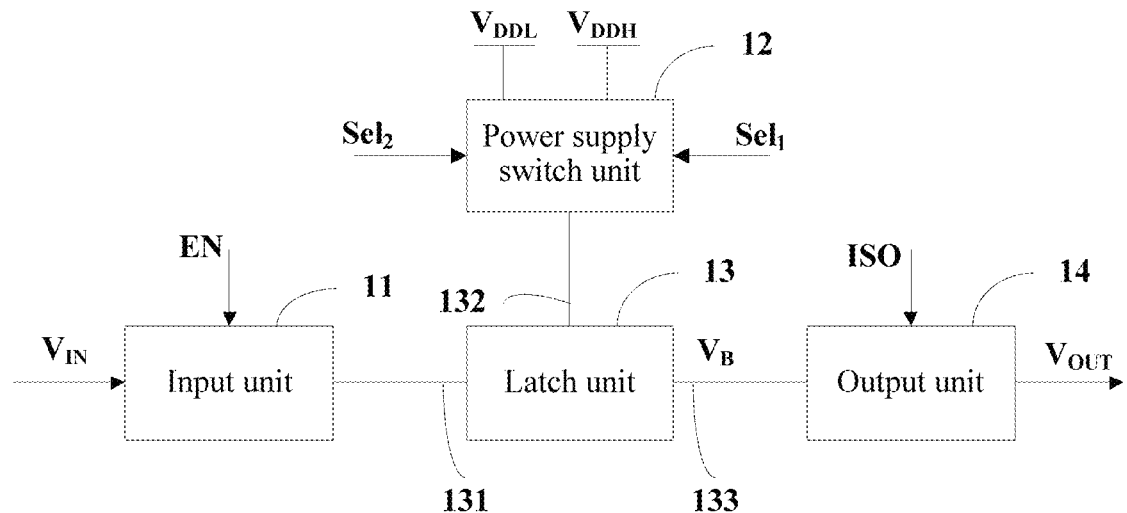
FIG. 1 is a schematic structural connection diagram of an LS according to some forms of the present disclosure.

The following describes in detail various exemplary embodiments and implementations of the present disclosure with reference to the accompanying drawings. It should be noted that, unless specifically described otherwise, the relative arrangement of the components and steps, the numerical expressions, and the numerical values set forth in the embodiments and implementations are not intended to limit the scope of the present disclosure.

In addition, it should be understood that, for ease of description, each part shown in the accompanying drawings is not necessarily drawn in actual proportion.

The following descriptions of at least one exemplary embodiment are merely illustrative, and are not intended to limit the present disclosure and the applications or uses thereof.

The technologies, methods and devices known to persons of ordinary skill in the related art may not be discussed in detail, and they should be considered as a part of the specification, if appropriate.

Any specific value in all illustrated and discussed examples should be considered merely an example rather than a limitation. Therefore, other examples of exemplary embodiments and implementations may have different values.

It should be noted that similar reference numerals and letters in the following accompanying drawings represent similar items. Therefore, if an item is defined in an accompanying drawing, the item does not need to be further discussed in the subsequent accompanying drawings.

FIG. 1 is a schematic structural connection diagram of an LS according to some forms of the present disclosure. The LS according to forms of the present disclosure may be configured to run in a first mode and a second mode, alternating with each other. As shown in FIG. 1, the LS may include: an input unit 11, a power supply switch unit 12, a latch unit 13, and an output unit 14.

The input unit 11 may be configured to: receive a first signal $V_{IN}$ (where the first signal may alternatively be referred to as an input signal), be turned on in the first mode to transmit the first signal $V_{IN}$ to the latch unit 13, and be turned off in the second mode. That is, in the second mode, the input unit no longer transmits the first signal $V_{IN}$ to the latch unit 13.

The power supply switch unit 12 may be configured to: transmit a first power supply voltage $V_{DDL}$ to the latch unit 13 in the first mode, and transmit a second power supply voltage $V_{DDH}$ to the latch unit 13 in the second mode. The first power supply voltage $V_{DDL}$ is lower than the second power supply voltage $V_{DDH}$. For example, the first power supply voltage $V_{DDL}$ may range from 0.5 V to 1.32 V. For example, the first power supply voltage $V_{DDL}$ may be 1.2 V. For example, the second power supply voltage $V_{DDH}$ may range from 1.62 V to 3.63 V. For example, the second power supply voltage $V_{DDH}$ may be 3.3 V.

The latch unit 13 may be configured to: latch the first signal $V_{IN}$ in the first mode, where a level amplitude of the latched first signal $V_{IN}$ is the first power supply voltage $V_{DDL}$, change the level amplitude of the first signal $V_{IN}$ from the first power supply voltage $V_{DDL}$ to the second power supply voltage $V_{DDH}$ in the second mode, and output, in each of the first mode and the second mode, a second signal $V_B$ whose logic is opposite to that of the first signal $V_{IN}$ to the output unit 14.

For example, the first signal $V_{IN}$ has, before being input to the latch unit 13, a level amplitude of the first power supply voltage $V_{DDL}$, that is, a level corresponding to a logic "1" of the first signal is the first power supply voltage $V_{DDL}$. In the first mode, the first signal $V_{IN}$ is latched by the latch unit 13 under the action of the first power supply voltage $V_{DDL}$. A level amplitude of the second signal $V_B$ whose logic is opposite to that of the first signal $V_{IN}$ (for example, when the logic of the first signal is "1", the logic of the second signal is "0"; when the logic of the first signal is "0", the logic of the second signal is "1") and that is output by the latch unit 13 to the output unit 14 is the first power supply voltage $V_{DDL}$. In the second mode, the latch unit 13 changes the level amplitude of the first signal $V_{IN}$ from the first power supply voltage $V_{DDL}$ to the second power supply voltage $V_{DDH}$, so that the level amplitude of the second signal $V_B$ output by the latch unit 13 is also changed to the second power supply voltage $V_{DDH}$. Therefore, in some implementations, the level amplitude of the second signal $V_B$ in the first mode is the first power supply voltage $V_{DDL}$, and the level amplitude of the second signal $V_B$ in the second mode is the second power supply voltage $V_{DDH}$.

The output unit 14 may be configured to: isolate the received second signal $V_B$ and output the second power supply voltage $V_{DDH}$ in the first mode, and output, in the second mode according to the received second signal $V_B$, a third signal $V_{OUT}$ whose logic is opposite to that of the second signal $V_B$ (where the third signal may alternatively be referred to as an output signal). A level amplitude of the third signal $V_{OUT}$ is the second power supply voltage $V_{DDH}$. In this case, because the logic of the third signal $V_{OUT}$ is opposite to that of the second signal $V_B$ (for example, when the logic of the second signal is "0", the logic of the third signal is "1"; when the logic of the second signal is "1", the logic of the third signal is "0"), and the logic of the second signal $V_B$ is opposite to that of the first signal $V_{IN}$, the logic of the third signal $V_{OUT}$ is the same as that of the first signal $V_{IN}$. Therefore, the output unit outputs a third signal $V_{OUT}$ having a same logic as that of the first signal $V_{IN}$ and having a level amplitude of the second power supply voltage $V_{DDH}$, thereby converting the first signal $V_{IN}$ input to the LS into the third signal $V_{OUT}$ having a higher level.

In the foregoing implementations, the LS includes: an input unit, a power supply switch unit, a latch unit, and an output unit. In the LS, in a first mode, the input unit transmits a received first signal to the latch unit, the power supply switch unit transmits a first power supply voltage to the latch unit, the latch unit latches the first signal and outputs a second signal whose logic is opposite to that of the first signal to the output unit, and the output unit isolates the received second signal and outputs a second power supply voltage; and in a second mode, the input unit is turned off, the power supply switch unit transmits the second power supply voltage to the latch unit, the latch unit changes a level amplitude of the latched first signal from the first power supply voltage to the second power supply voltage and outputs a second signal to the output unit, and the output unit outputs, according to the received second signal, a third signal whose logic is opposite to that of the second signal, where a level amplitude of the third signal is the second power supply voltage.

By using the LS in forms of the present disclosure, signal isolation may be implemented between different voltage domains, so that a logic error can be avoided as much as possible. A value of 0 or 1 may exist in a circuit of an LS in the prior art when the LS does not operate, so that a voltage output to a next stage is an indefinite value, causing a logic error. In the LS in forms of the present disclosure, however, an output unit having an isolation function is included, so that a logic error can be avoided. Furthermore, a static power consumption can be reduced by using forms of the foregoing LS. For example, when the LS in forms of the present disclosure is used, a static power consumption performance of the LS is relatively good when a low voltage is input. For example, an average static power consumption may be lower than 70 pW, thereby ensuring that an IoT apparatus has a feature of having a low power consumption in a standby state.

In addition, in the LS in forms of the present disclosure, a voltage selection function and an isolation function are integrated into an architecture of the LS, so that the single LS not only can select an input voltage, but also implement the isolation function when not operate.

In some implementations, as shown in FIG. 1, the latch unit 13 may include: a signal input end 131, a voltage input end 132, and a signal output end 133. The signal input end 131 may be configured to receive the first signal $V_{IN}$ from the input unit 11. The voltage input end 132 may be configured to: receive the first power supply voltage $V_{DDL}$ from the power supply switch unit 12 in the first mode, and receive the second power supply voltage $V_{DDH}$ from the power supply switch unit 12 in the second mode. The signal output end 133 may be configured to output the second signal $V_B$ to the output unit 14.

In some implementations, as shown in FIG. 1, the input unit 11 may further be configured to be turned on or turned off according to a received enable signal EN.

In some implementations, as shown in FIG. 1, the power supply switch unit 12 may further be configured to: transmit the first power supply voltage $V_{DDL}$ to the latch unit 13 after receiving a first selection signal $Sel_1$ in the first mode, and transmit the second power supply voltage $V_{DDH}$ to the latch unit 13 after receiving a second selection signal $Sel_2$ in the second mode.

In some implementations, as shown in FIG. 1, the output unit 14 may further be configured to output the second power supply voltage $V_{DDH}$ or the third signal $V_{OUT}$ according to a received isolation signal ISO.

Figure 2:
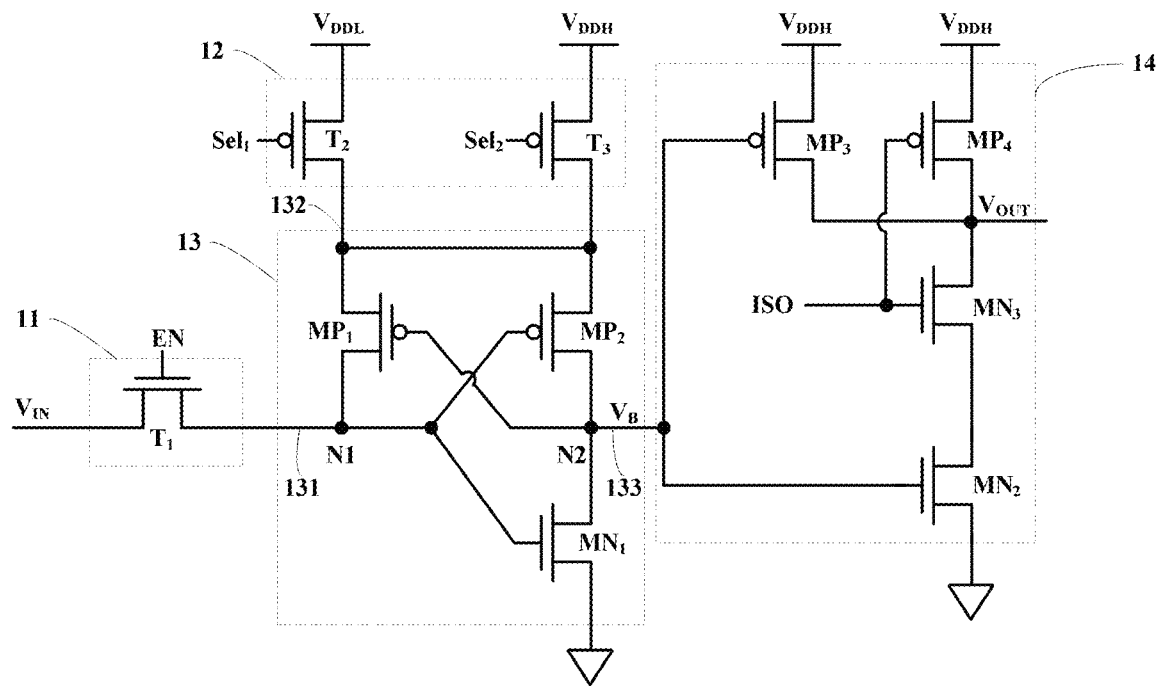
FIG. 2 is a schematic structural connection diagram of an LS according to other forms of the present disclosure.

FIG. 2 is a schematic structural connection diagram of an LS according to other forms of the present disclosure.

In some implementations, as shown in FIG. 2, a latch unit 13 may include: a first PMOS transistor $MP_1$, a second PMOS transistor $MP_2$, a first NMOS transistor $MN_1$, a first node N1, and a second node N2. A source of the first PMOS transistor $MP_1$ and a source of the second PMOS transistor $MP_2$ are connected to a voltage input end 132. That is, the source of the first PMOS transistor $MP_1$ and the source of the second PMOS transistor $MP_2$ are connected to each other, and connected to the voltage input end 132. A drain of the first PMOS transistor $MP_1$, a gate of the second PMOS transistor $MP_2$ and a gate of the first NMOS transistor $MN_1$ are connected to the first node N1. The first node N1 is connected to a signal input end 131. A gate of the first PMOS transistor $MP_1$, a drain of the second PMOS transistor $MP_2$, and a drain of the first NMOS transistor $MN_1$ are connected to the second node N2. The second node N2 is connected to a signal output end 133. A source of the first NMOS transistor $MN_1$ is connected to a ground terminal.

In some implementations, as shown in FIG. 2, an input unit 11 may include a first switch transistor $T_1$. A gate of the first switch transistor $T_1$ is configured to receive an enable signal EN. A first electrode (for example, a drain) of the first switch transistor $T_1$ is configured to receive a first signal $V_{IN}$. A second electrode (for example, a source) of the first switch transistor $T_1$ is connected to the signal input end 131 of the latch unit 13. For example, the first switch transistor may be an NMOS transistor or a PMOS transistor.

In some implementations, as shown in FIG. 2, the power supply switch unit 12 may include a second switch transistor $T_2$ and a third switch transistor $T_3$. A gate of the second switch transistor $T_2$ may be configured to receive a first selection signal $Sel_1$. A first electrode and a second electrode of the second switch transistor $T_2$ are respectively connected to the voltage input end 132 of the latch unit 13 and a first power supply voltage end configured to provide a first power supply voltage $V_{DDL}$. A gate of the third switch transistor $T_3$ may be configured to receive a second selection signal $Sel_2$. A first electrode and a second electrode of the third switch transistor $T_3$ are respectively connected to the voltage input end 132 of the latch unit 13 and a second power supply voltage end configured to provide a second power supply voltage $V_{DDH}$.

In some implementations, the second switch transistor $T_2$ and the third switch transistor $T_3$ may be switch transistors having same conductivity types. For example, as shown in FIG. 2, the second switch transistor $T_2$ and the third switch transistor $T_3$ may be PMOS transistors. In this case, the first electrode and the second electrode of the second switch transistor $T_2$ may be respectively a drain and a source, and the first electrode and the second electrode of the third switch transistor $T_3$ may be respectively a drain and a source. In another example, the second switch transistor $T_2$ and the third switch transistor $T_3$ may be NMOS transistors. In this case, the first electrode and the second electrode of the second switch transistor $T_2$ may be respectively a source and a drain, and the first electrode and the second electrode of the third switch transistor $T_3$ may be respectively a source and a drain.

Figure 10:
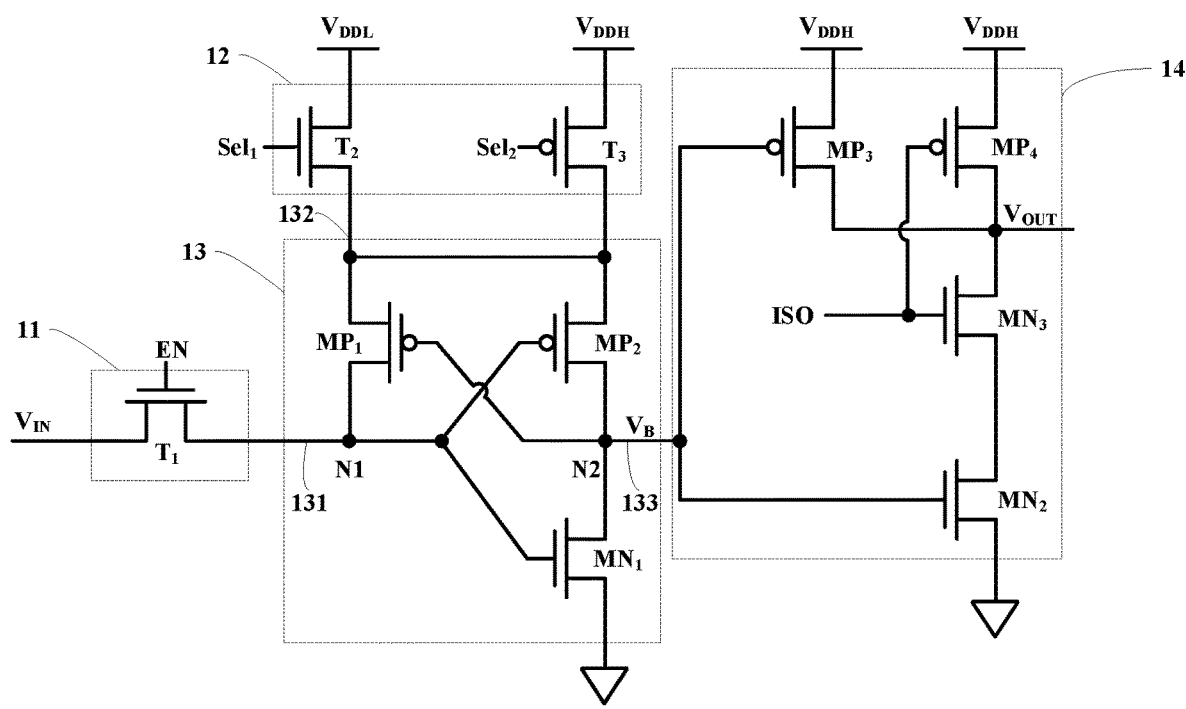
FIG. 10 is a schematic structural connection diagram of an LS according to other forms of the present disclosure.

In other implementations, the second switch transistor T2 and the third switch transistor T3 may be switch transistors having opposite conductivity types. For example, as shown in FIG. 10, the second switch transistor T2 is an NMOS transistor, and the third switch transistor T3 is a PMOS transistor; or the second switch transistor T2 is a PMOS transistor, and the third switch transistor T3 is an NMOS transistor.

In some implementations, as shown in FIG. 2, the output unit 14 may include: a third PMOS transistor $MP_3$, a fourth PMOS transistor $MP_4$, a second NMOS transistor $MN_2$, and a third NMOS transistor $MN_3$. A source of the third PMOS transistor $MP_3$ and a source of the fourth PMOS transistor $MP_4$ are connected to a second power supply voltage end configured to provide the second power supply voltage $V_{DDH}$. A gate of the third PMOS transistor $MP_3$ and a gate of the second NMOS transistor $MN_2$ are connected to the signal output end 133 of the latch unit 13. A gate of the fourth PMOS transistor $MP_4$ and a gate of the third NMOS transistor $MN_3$ are connected to each other and are configured to receive an isolation signal ISO. A drain of the third PMOS transistor $MP_3$, a drain of the fourth PMOS transistor $MP_4$, and a drain of the third NMOS transistor $MN_3$ are connected to each other and serve as an output end of the output unit 14. A source of the third NMOS transistor $MN_3$ is connected to a drain of the second NMOS transistor $MN_2$. A source of the second NMOS transistor $MN_2$ is connected to a ground terminal.

It should be noted that, the specific circuit structures of the input unit 11, the power supply switch unit 12, the latch unit 13, and the output unit 14 shown in FIG. 2 are merely exemplary, and the scope of the present disclosure is not limited thereto.

Figure 3:
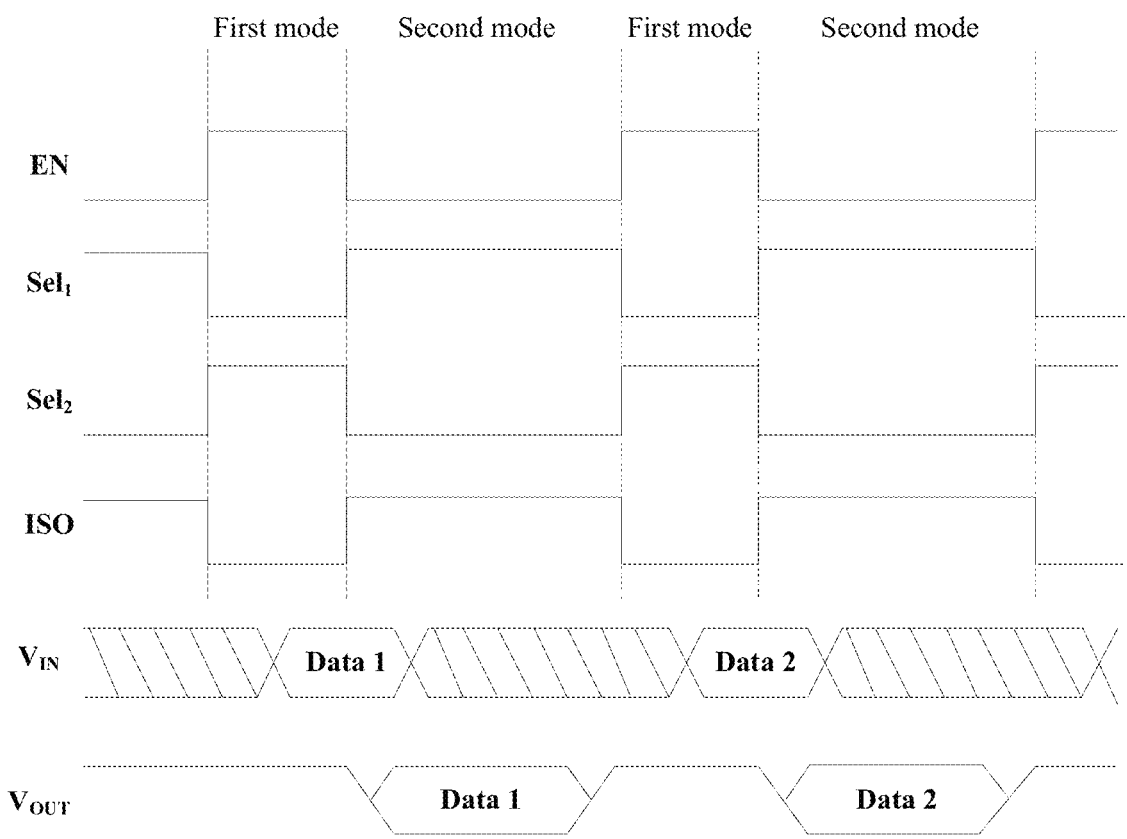
FIG. 3 is a schematic sequence control diagram of an LS according to some forms of the present disclosure.

FIG. 3 is a schematic sequence control diagram of an LS according to some forms of the present disclosure. The following describes a running process of the LS according to some forms of the present disclosure in detail with reference to FIG. 2 and FIG. 3. The LS runs in a first mode and second mode, alternating with each other, that is, the two modes are switched during operation.

The following describes a running process in the first mode.

A first switch transistor $T_1$ of an input unit 11 is turned on after receiving a high-level enable signal EN, and transmits a received first signal $V_{IN}$ (for example, Data 1 or Data 2 of the first signal $V_{IN}$ shown in FIG. 3) to a latch unit 13.

A second switch transistor $T_2$ of a power supply switch unit 12 is turned on after receiving a low-level first selection signal $Sel_1$, and transmits a first power supply voltage $V_{DDL}$ to the latch unit 13. A third switch transistor $T_3$ is turned off after receiving a high-level second selection signal $Sel_2$.

A first node N1 of the latch unit 13 latches the first signal $V_{IN}$, and outputs a second signal $V_B$ whose logic is opposite to that of the first signal to an output unit 14.

For example, if the first signal has a logic "1" (for example, a high level), a level corresponding to the logic "1" is the first power supply voltage $V_{DDL}$. The logic "1" may cause a first NMOS transistor $MN_1$ to be turned on and a second PMOS transistor $MP_2$ to be turned off. A second node N2 is connected to a ground terminal, so that a logic "0" (for example, a low level) is stored on the second node N2. The logic "0" may cause a first PMOS transistor $MP_1$ to be turned on, so that the first power supply voltage $V_{DDL}$ passes through the second switch transistor $T_2$ and the first PMOS transistor $MP_1$ to the first node N1, and the logic "1" is latched on the first node N1. In addition, the logic "0" on the second node may be used as the second signal $V_B$ and output to the output unit 14.

For another example, if the first signal has a logic "0" (for example, a low level), the first node N1 latches the logic "0". The logic "0" may cause the first NMOS transistor $MN_1$ to be turned off and the second PMOS transistor $MP_2$ to be turned on. Because the second switch transistor $T_2$ is turned on, the first power supply voltage $V_{DDL}$ passes through the second switch transistor $T_2$ and the second PMOS transistor $MP_2$ to the second node N2, and the second node N2 stores a logic "1" (for example, a high level). A level corresponding to the logic "1" is the first power supply voltage $V_{DDL}$, and the logic "1" on the second node may be used as the second signal $V_B$ and output to the output unit 14.

After the output unit 14 receives a low-level isolation signal ISO, the fourth PMOS transistor $MP_4$ is turned on and the third NMOS transistor $MN_3$ is turned off. In this case, the second signal $V_B$ is isolated regardless of whether the second signal $V_B$ output to the output unit 14 has a logic "0" or a logic "1". A second power supply voltage $V_{DDH}$ is output by using the fourth PMOS transistor $MP_4$.

The following describes a running process in the second mode.

The first switch transistor $T_1$ of the input unit 11 is turned off after receiving a low-level enable signal EN, so that in the second mode, the first signal $V_{IN}$ does not affect the latch unit 13.

The third switch transistor $T_3$ of the power supply switch unit 12 is turned on after receiving a low-level second selection signal $Sel_2$, and transmits the second power supply voltage $V_{DDH}$ to the latch unit 13. The second switch transistor $T_2$ is turned off after receiving a high-level first selection signal $Sel_1$.

The latch unit 13 changes a level amplitude of the latched first signal $V_{IN}$ from the first power supply voltage $V_{DDL}$ to the second power supply voltage $V_{DDH}$, and outputs a second signal $V_B$ whose logic is opposite to that of the first signal $V_{IN}$ to the output unit 14.

For example, if the first signal latched on the first node N1 has a logic "1" (for example, a high level), as described above, the second node N2 stores a logic "0" (for example, a low level). The logic "0" may cause the first PMOS transistor $MP_1$ to be turned on, so that the second power supply voltage $V_{DDH}$ may pass through the third switch transistor $T_3$ and the first PMOS transistor $MP_1$ to the first node N1, and the level corresponding to the logic "1" of the first signal on the first node N1 is changed to the second power supply voltage $V_{DDH}$. In addition, the corresponding logic "0" on the second node is used as the second signal $V_B$ and output to the output unit 14.

For another example, if the first signal latched on the first node N1 has a logic "0" (for example, a low level), as described above, the second node N2 stores a logic "1" (for example, a high level). The logic "0" on the first node N1 may cause the first NMOS transistor $MN_1$ to be turned off and the second PMOS transistor $MP_2$ to be turned on. Therefore, the second power supply voltage $V_{DDH}$ may pass through the third switch transistor $T_3$ and the second PMOS transistor $MP_2$ to the second node N2. In this way, the level corresponding to the logic "1" on the second node is changed to the second power supply voltage $V_{DDH}$, and the logic "1" is used as the second signal $V_B$ and output to the output unit 14.

After the output unit 14 receives a high-level isolation signal ISO, the fourth PMOS transistor $MP_4$ is turned off and the third NMOS transistor $MN_3$ is turned on. In this case, the third PMOS transistor $MP_3$ and the second NMOS transistor $MN_2$ may be used as a phase inverter together. After receiving the second signal $V_B$, the phase inverter outputs a third signal $V_{OUT}$ (for example, Data 1 or Data 2 of the third signal $V_{OUT}$ shown in FIG. 3) whose logic is opposite to that of the second signal $V_B$. A level amplitude of the third signal $V_{OUT}$ is the second power supply voltage $V_{DDH}$.

In the foregoing implementations, after performing the running process in the first mode and that in the second mode, the LS achieves the following objective: outputting the third signal $V_{OUT}$ whose level amplitude is the second power supply voltage $V_{DDH}$ after receiving the first signal $V_{IN}$ whose level amplitude is the first power supply voltage $V_{DDL}$ where the logic of the third signal $V_{OUT}$ is the same as that of the first signal $V_{IN}$, thereby implementing a level shifting function. In addition, by using the foregoing LS, signal isolation may be implemented between different voltage domains, so that a logic error can be avoided as much as possible, and a static power consumption can be reduced.

In some implementations, when the second switch transistor $T_2$ and the third switch transistor $T_3$ are switch transistors having same conductivity types (for example, as shown in FIG. 2, $T_2$ and $T_3$ are PMOS transistors), the first selection signal $Sel_1$ and the second selection signal $Sel_2$ are complementary signals (that is, the first selection signal $Sel_1$ and the second selection signal $Sel_2$ are opposite signals in a same running mode), for example, as shown in FIG. 3. In some implementations, manufacturing of a circuit may be facilitated by designing the second switch transistor $T_2$ and the third switch transistor $T_3$ to be switch transistors having same conductivity types.

In other implementations, when the second switch transistor $T_2$ and the third switch transistor $T_3$ are switch transistors having opposite conductivity types, the first selection signal $Sel_1$ and the second selection signal $Sel_2$ are the same signals. For example, the second switch transistor $T_2$ is an NMOS transistor, and the third switch transistor $T_3$ is a PMOS transistor, so that the first selection signal and the second selection signal may be united as the second selection signal $Sel_2$ shown in FIG. 3. In another example, the second switch transistor $T_2$ is a PMOS transistor, and the third switch transistor $T_3$ is an NMOS transistor, so that the first selection signal and the second selection signal may be united as the first selection signal $Sel_1$ shown in FIG. 3. In some implementations, one selection signal may be omitted, that is, a quantity of the control signals may be reduced. This can help stabilize running of the LS.

In some implementations, the enable signal and the second selection signal may be a set mode running signal LAT, and the first selection signal and the isolation signal may be a complementary signal LAT_B of the mode running signal. In this way, the four control signals can be reduced to two control signals, thereby facilitating stable running of the LS.

Figure 4:
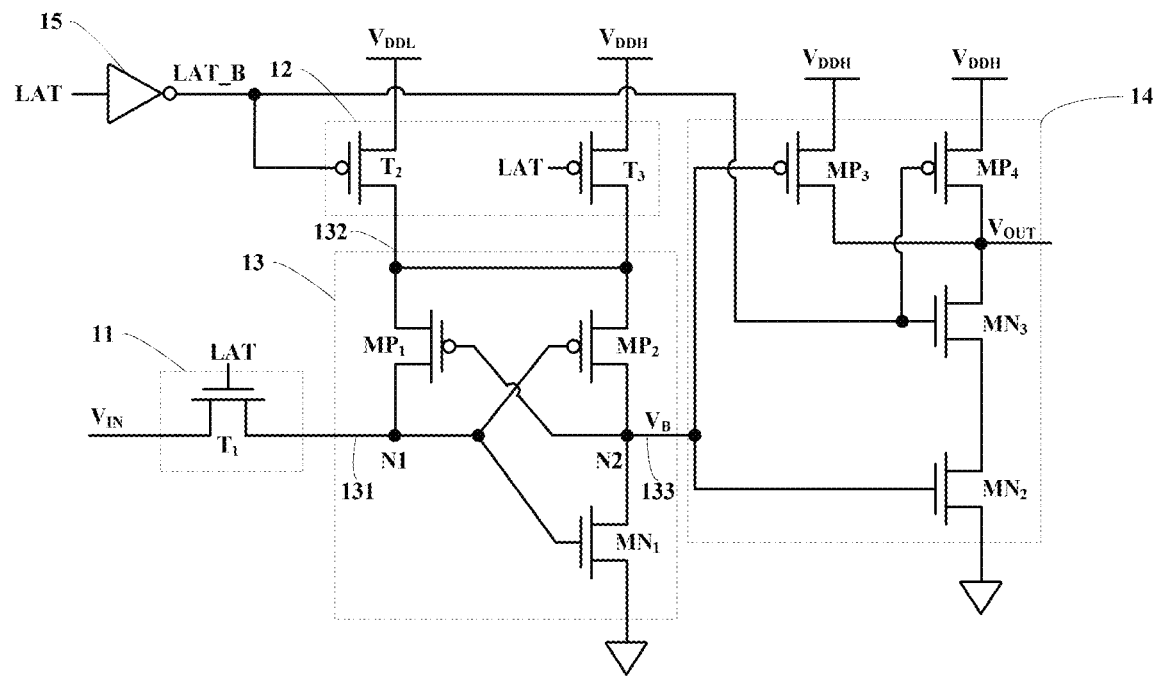
FIG. 4 is a schematic structural connection diagram of an LS according to other forms of the present disclosure.
Figure 5:
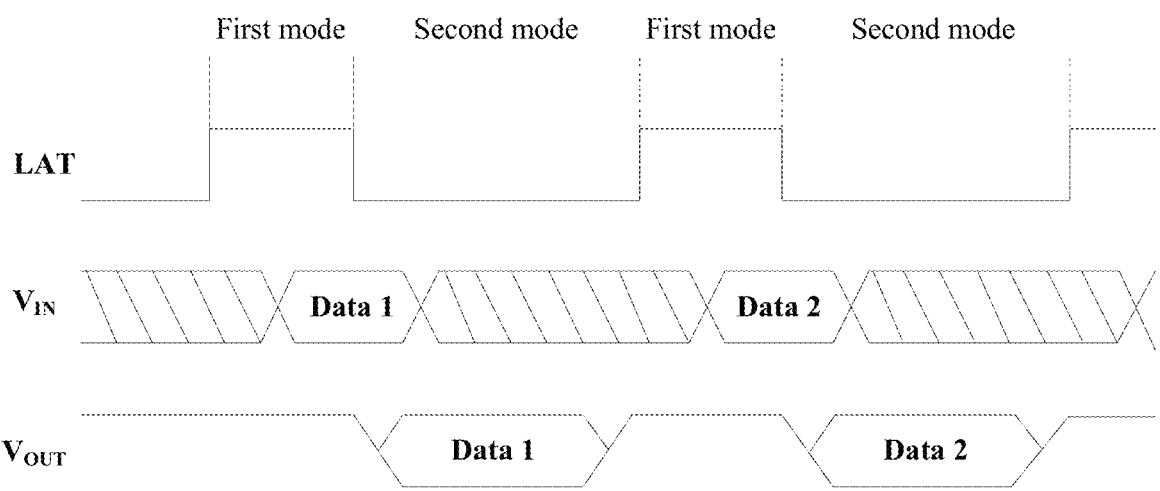
FIG. 5 is a schematic sequence control diagram of an LS according to other forms of the present disclosure.

FIG. 4 is a schematic structural connection diagram of an LS according to other implementations of the present disclosure. FIG. 5 is a schematic sequence control diagram of an LS according to other implementations of the present disclosure.

In some implementations, as shown in FIG. 4, a mode running signal LAT (for example, as shown in FIG. 5) is input to a first switch transistor $T_1$ of an input unit 11 and a third switch transistor $T_3$ of a power supply switch unit 12 and used as an enable signal and a second selection signal.

In some implementations, as shown in FIG. 4, the LS shown in FIG. 4 further includes a phase inverter 15 in addition to the same components as those in the LS shown in FIG. 2. The phase inverter 15 may be configured to: after receiving the mode running signal LAT (for example, as shown in FIG. 5), output a complementary signal LAT_B (not shown in FIG. 5) of the mode running signal to the power supply switch unit 12 and an output unit 14. For example, the complementary signal LAT_B of the mode running signal is output to a second switch transistor $T_2$ of the power supply switch unit 12 and used as a first selection signal, and the complementary signal LAT_B is further output to the output unit 14 and used as an isolation signal.

In forms of the LS in the foregoing implementations, the mode running signal LAT is input to the first switch transistor $T_1$ and the third switch transistor $T_3$, and used as an enable signal and a second selection signal, and the phase inverter outputs a complementary signal LAT_B of the mode running signal after receiving the mode running signal LAT, and outputs the complementary signal LAT_B to the second switch transistor $T_2$ and the output unit 14 to use the complementary signal LAT_B as a first selection signal and an isolation signal. In some implementations, the functions of the foregoing four control signals (that is, the enable signal, the first selection signal, the second selection signal, and the isolation signal) are implemented using one mode running signal LAT, thereby greatly reducing a quantity of the control signals and facilitating stable running of the LS.

Figure 6:
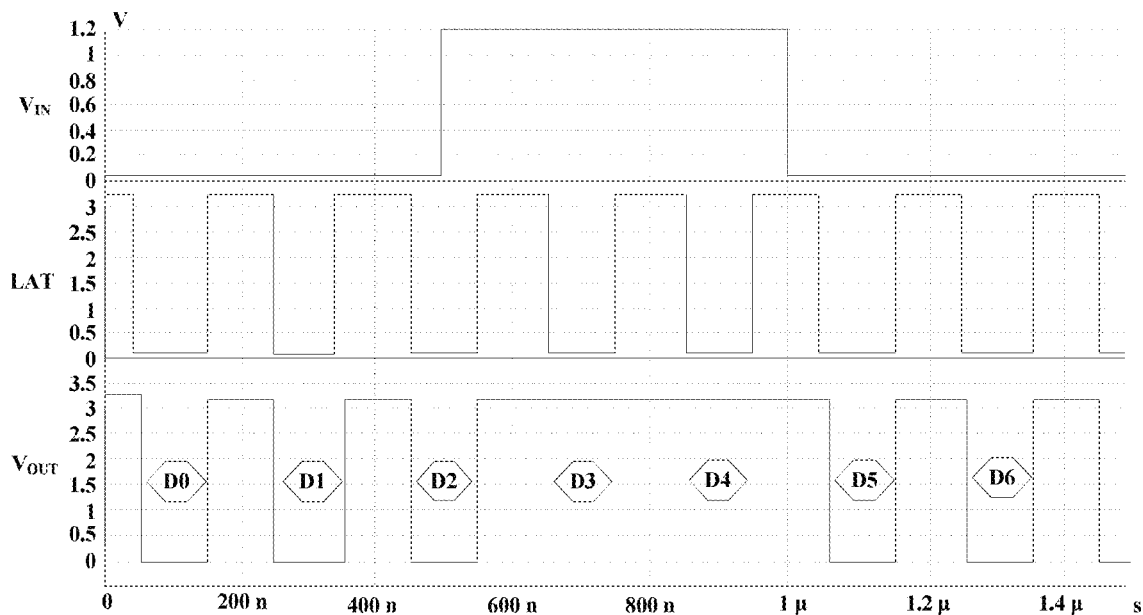
FIG. 6 is a schematic sequence control diagram of an LS according to other forms of the present disclosure.

FIG. 6 is a schematic sequence control diagram of an LS according to other forms of the present disclosure.

As shown in FIG. 6, after receiving a first signal $V_{IN}$, the LS outputs a third signal $V_{OUT}$ in a falling edge of a mode running signal LAT. The third signal $V_{OUT}$ may last from the falling edge of the mode running signal LAT to a next rising edge, for example, output data signals D0 to D6 shown in FIG. 6. As shown in FIG. 6, the output third signal $V_{OUT}$ may depend on an input signal when LAT=1. For example, when LAT=1, before D0, the input signal $V_{IN}$=0, and a value saved in a latch unit is also 0. Therefore, when the LAT performs conversion, the output value D0 is also 0. For another example, when LAT=1, before D3, the input signal $V_{IN}$=1, and a value saved in a latch unit is also 1. Therefore, when the LAT performs conversion, the output value D3 is also 1.

In addition, it can be seen from FIG. 6 that, a level amplitude of the first signal $V_{IN}$ may be 1.2 V, and a level amplitude of the third signal $V_{OUT}$ may be 3.3 V. Therefore, signal level conversion is implemented in the LS.

Figure 7:
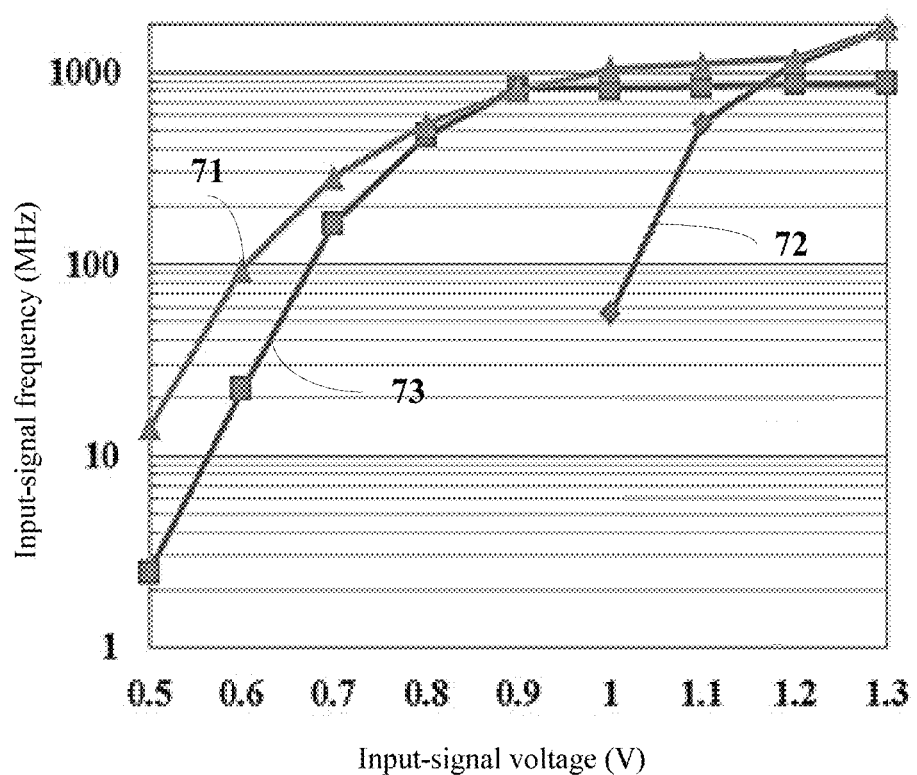
FIG. 7 is a diagram of a test result relationship between an input-signal frequency and an input-signal voltage of an LS in the prior art and that of an LS according to a form of the present disclosure.

FIG. 7 is a diagram of a test result relationship between an input-signal frequency and an input-signal voltage of an LS in the prior art and that of an LS according to an embodiment of the present disclosure. An input signal herein is the first signal $V_{IN}$ described above. It can be seen from FIG. 7 that, compared with an LS based on DCVS (referring to a curve 72) and an LS having an adaptive PUNs structure (referring to a curve 73) in the prior art, the LS in the present disclosure (referring to a curve 71) may have a wider input-signal voltage range. In addition, compared with the LSs in the prior art, the LS in the present disclosure may accept a higher input-signal frequency, thereby being capable of operating in an environment having a higher speed. Therefore, the LS in the present disclosure has a higher operating speed.

FIG. 8 is a diagram of a test result relationship between a static power consumption and an input-signal voltage of an LS in the prior art and that of an LS according to an embodiment of the present disclosure. An input signal herein is the first signal $V_{IN}$ described above. It can be seen from FIG. 8 that, compared with an LS based on DCVS (referring to a curve 82) and an LS having an adaptive PUNs structure (referring to a curve 83) in the prior art, the LS in the present disclosure (referring to a curve 81) may have a lower static power consumption under the same input-signal voltages. Therefore, a static power consumption can be reduced by using the LS in the present disclosure.

Table 1 is a simulated result data table of an LS according to an embodiment of the present disclosure. Table 1 shows static power consumptions, dynamic power consumptions, and frequencies of a first signal $V_{IN}$ under different level amplitudes. It can be seen from Table 1 that, the static power consumptions of the LS in this embodiment of the present disclosure are substantially lower than 70 pW. Therefore, leakage current is small and a power consumption is low when the LS does not operate. In addition, the LS in this implementation of the present disclosure can operate at a frequency higher than that at which an LS in the prior art operates, and can operate in an environment exceeding 1 GHz when under at least 1 V. Therefore, the LS in this implementation of the present disclosure has such advantages as having a low power consumption and capable of operating at a high speed.

TABLE 1

| Simulated result data table of LS | | | | | | | | | |
|---|---|---|---|---|---|---|---|---|---|
| $V_{DDL}$ (V) | 0.5 | 0.6 | 0.7 | 0.8 | 0.9 | 1.0 | 1.1 | 1.2 | 1.3 |
| Static power consumption (pW) | 69.1 | 67.4 | 66.1 | 64.5 | 62.8 | 60.8 | 59.1 | 55 | 56 |

TABLE 1-continued

Simulated result data table of LS

| Dynamic power consumption (pW) | 5.801 | 5.842 | 5.941 | 5.83 | 3.782 | 0.1549 | 0.1688 | 0.1975 | 0.2283 |
|---|---|---|---|---|---|---|---|---|---|
| Frequency (MHz) | 14.1 | 95.2 | 286 | 541 | 800 | 1053 | 1111 | 1176 | 1695 |

Table 2 is a performance comparison table between an LS in the present disclosure and an LS in the prior art. It can be seen from Table 2 that, an LS according to an implementation of the present disclosure has a wider voltage conversion range, and may implement voltage conversion in a range from 0.5 V to 3.3 V. In addition, the area of the LS in forms of the present disclosure is the smallest.

It should be noted that frequency in Table 2 represents a lowest operating frequency, Etr represents an energy consumption in a unit period, where the unit "fJ" represents $10^{-15}$ joules, and Ps represents a static power consumption. It can be seen from Table 2 that, the LS in this implementation of the present disclosure can operate, at a lowest operating frequency, in an environment with a relatively low voltage (for example, 0.5 V), causes the lowest energy consumption when transmitting signals in a unit period, and has the lowest static power consumption.

TABLE 2

Performance comparison table between an LS in the present disclosure and an LS in the prior art

| Design | Technology node | Conversion range | Frequency (MHz) | $E_{tr}$ (fJ) | Ps (pW) | Area |
|---|---|---|---|---|---|---|
| DCVS | 55 nm | 1.0-3.3 V | 55.6 (1.0→3.3 V) | 2310 (1.0→3.3 V-55.6 MHz) | 90.81 (1.0 V) | Medium |
| PUNs | 55 nm | 0.5-3.3 V | 2.46 (0.5→3.3 V) | 2648 (0.5→3.3 V-2.46 MHz) | 69.35 (1.0 V) | Largest |
| The present disclosure | 55 nm | 0.5-3.3 V | 14.1 (0.5→3.3 V) | 872 (0.5→3.3 V-14.1 MHz) | 60.74 (1.0 V) | Smallest |

According to forms of the present disclosure, an integrated circuit may further be provided. The integrated circuit may include the LS described above (for example, the LS shown in FIG. 1, FIG. 2, or FIG. 4).

FIG. 9 is a flowchart of a method of performing level shifting processing by using an LS according to some forms of the present disclosure.

Step S902: In a first mode, an input unit receives a first signal and transmits the first signal to a latch unit, a power supply switch unit transmits a first power supply voltage to the latch unit, the latch unit latches the first signal and outputs a second signal whose logic is opposite to that of the first signal to an output unit, and the output unit isolates the received second signal and outputs a second power supply voltage.

Step S904: In a second mode, the input unit is turned off, the power supply switch unit transmits the second power supply voltage to the latch unit, the latch unit changes a level amplitude of the latched first signal from the first power supply voltage to the second power supply voltage and outputs a second signal whose logic is opposite to that of the first signal to the output unit, and the output unit outputs, according to the received second signal, a third signal whose logic is opposite to that of the second signal, where a level amplitude of the third signal is the second power supply voltage.

In the foregoing implementations, according to the method of performing level shifting processing by using the LS in the embodiments of the present disclosure, signal isolation may be implemented between different voltage domains, so that a logic error can be avoided as much as possible, and a static power consumption can be reduced.

In some implementations, the step (that is, step S902) performed in the first mode and the step (that is, step S904) performed in the second mode are alternately performed.

Above, implementations of the LS, the integrated circuit, and the method according to forms of the present disclosure are described in detail. To prevent the ideas of the present disclosure from being obstructed, some details well-known in the art are not described. Persons skilled in the art will understand, according to the foregoing descriptions, how to implement the technical solutions disclosed herein.

Although some specific embodiments and implementations of the present disclosure are described in detail by way of example, persons skilled in the art should understand that the foregoing examples are merely for description and do not limit the scope of the present disclosure. Persons skilled in the art will understand that they may make modifications to the foregoing embodiments without departing from the scope and spirit of the present disclosure. The scope of the present disclosure is subject to the appended claims.

What is claimed is:

1. A level shifter (LS), configured to run in a first mode and a second mode alternating with each other, wherein the LS comprises:
   an input unit that is configured to:
      receive a first signal,
      be turned on in the first mode to transmit the first signal to a latch unit, and
      be turned off in the second mode;
   a power supply switch unit that is configured to:
      transmit a first power supply voltage to the latch unit in the first mode, and
      transmit a second power supply voltage to the latch unit in the second mode,
      wherein the first power supply voltage is lower than the second power supply voltage;

the latch unit that is configured to:
  latch the first signal in the first mode, wherein a level amplitude of a latched first signal is equal to the first power supply voltage,
  change the level amplitude of the first signal from the first power supply voltage to the second power supply voltage in the second mode, and
  output, in each of the first mode and the second mode, a second signal whose logic is opposite to that of the first signal to an output unit; and
the output unit that is configured to:
  isolate the received second signal and output the second power supply voltage in the first mode, and
  output, in the second mode according to the received second signal, a third signal whose logic is opposite to that of the second signal,
  wherein a level amplitude of the third signal is equal to the second power supply voltage.

2. The LS according to claim 1, wherein:
a level amplitude of the second signal in the first mode is equal to the first power supply voltage; and
a level amplitude of the second signal in the second mode is equal to the second power supply voltage.

3. The LS according to claim 1, wherein the latch unit further comprises:
  a signal input end that is configured to receive the first signal from the input unit;
  a voltage input end that configured to:
    receive the first power supply voltage from the power supply switch unit in the first mode, and
    receive the second power supply voltage from the power supply switch unit in the second mode; and
  a signal output end that is configured to output the second signal to the output unit.

4. The LS according to claim 3, wherein:
the latch unit further comprises:
  a first p-channel metal oxide semiconductor (PMOS) transistor,
  a second PMOS transistor,
  a first N-channel metal oxide semiconductor (NMOS) transistor,
  a first node, and
  a second node,
wherein a source of the first PMOS transistor and a source of the second PMOS transistor are connected to the voltage input end;
wherein a drain of the first PMOS transistor, a gate of the second PMOS transistor and a gate of the first NMOS transistor are connected to the first node, where the first node is connected to the signal input end;
wherein a gate of the first PMOS transistor, a drain of the second PMOS transistor and a drain of the first NMOS transistor are connected to the second node, where the second node is connected to the signal output end; and
wherein a source of the first NMOS transistor is connected to a ground terminal.

5. The LS according to claim 3, wherein the input unit is further configured to be turned on or turned off according to a received enable signal.

6. The LS according to claim 5, wherein:
the input unit comprises a first switch transistor,
a gate of the first switch transistor is configured to receive the enable signal,
a first electrode of the first switch transistor is configured to receive the first signal, and
a second electrode of the first switch transistor is connected to the signal input end of the latch unit.

7. The LS according to claim 5, wherein the power supply switch unit is further configured to:
  transmit the first power supply voltage to the latch unit after receiving a first selection signal in the first mode, and
  transmit the second power supply voltage to the latch unit after receiving a second selection signal in the second mode.

8. The LS according to claim 7, wherein:
the power supply switch unit comprises a second switch transistor and a third switch transistor,
a gate of the second switch transistor is configured to receive the first selection signal, and a first electrode and a second electrode of the second switch transistor are respectively connected to the voltage input end of the latch unit and a first power supply voltage end configured to provide the first power supply voltage; and
a gate of the third switch transistor is configured to receive the second selection signal, and a first electrode and a second electrode of the third switch transistor are respectively connected to the voltage input end of the latch unit and a second power supply voltage end configured to provide the second power supply voltage.

9. The LS according to claim 8, wherein:
when the second switch transistor and the third switch transistor are switch transistors having the same conductivity types, the first selection signal and the second selection signal are complementary signals; and
when the second switch transistor and the third switch transistor are switch transistors having opposite conductivity types, the first selection signal and the second selection signal are the same signals.

10. The LS according to claim 7, wherein the output unit is further configured to output the second power supply voltage or the third signal according to a received isolation signal.

11. The LS according to claim 10, wherein:
the output unit comprises:
  a third PMOS transistor,
  a fourth PMOS transistor,
  a second NMOS transistor, and
  a third NMOS transistor,
  a source of the third PMOS transistor and a source of the fourth PMOS transistor are connected to a second power supply voltage end configured to provide the second power supply voltage;
  a gate of the third PMOS transistor and a gate of the second NMOS transistor are connected to the signal output end of the latch unit;
  a gate of the fourth PMOS transistor and a gate of the third NMOS transistor are connected to each other and are configured to receive the isolation signal;
  a drain of the third PMOS transistor, a drain of the fourth PMOS transistor and a drain of the third NMOS transistor are connected to each other and serve as an output end of the output unit;
  a source of the third NMOS transistor is connected to a drain of the second NMOS transistor, and
  a source of the second NMOS transistor is connected to a ground terminal.

12. The LS according to claim 10, wherein the enable signal and the second selection signal are set mode running signals, and the first selection signal and the isolation signal are complementary signals of the mode running signals.

13. The LS according to claim 12, further comprising:
a phase inverter, configured to: after receiving the mode running signals, output the complementary signals of the mode running signals to the power supply switch unit and the output unit.

14. An integrated circuit, comprising: the LS according to any one of claim 1.

15. A method of performing level shifting processing using the LS according to claim 1, the method comprising:
in the first mode, receiving, by the input unit, the first signal and transmitting the first signal to the latch unit, transmitting, by the power supply switch unit, the first power supply voltage to the latch unit, latching, by the latch unit, the first signal and outputting the second signal whose logic is opposite to that of the first signal to the output unit, and isolating, by the output unit, the received second signal and outputting the second power supply voltage; and in the second mode, turning off the input unit, transmitting, by the power supply switch unit, the second power supply voltage to the latch unit, changing, by the latch unit, the level amplitude of the latched first signal from the first power supply voltage to the second power supply voltage and outputting the second signal whose logic is opposite to that of the first signal to the output unit, and outputting, by the output unit according to the received second signal, the third signal whose logic is opposite to that of the second signal, wherein the level amplitude of the third signal is the second power supply voltage.

16. The method according to claim 15, comprising:
alternately performing the step performed in the first mode and the step performed in the second mode.

\* \* \* \* \*